United States Patent
Paul et al.

(10) Patent No.: US 12,456,602 B2
(45) Date of Patent: Oct. 28, 2025

(54) SEMICONDUCTOR PROCESSING CHAMBERS AND METHODS FOR DEPOSITION AND ETCH

(71) Applicant: Applied Materials, Inc., Santa Clara, CA (US)

(72) Inventors: Khokan Chandra Paul, Cupertino, CA (US); Ravikumar Patil, Karnataka (IN); Vijet Patil, Bangalore (IN); Carlaton Wong, Sunnyvale, CA (US); Adam J. Fischbach, Campbell, CA (US); Timothy Franklin, Campbell, CA (US); Tsutomu Tanaka, Santa Clara, CA (US); Canfeng Lai, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/342,848

(22) Filed: Jun. 28, 2023

(65) Prior Publication Data

US 2023/0343552 A1    Oct. 26, 2023

Related U.S. Application Data

(63) Continuation of application No. 17/014,195, filed on Sep. 8, 2020, now Pat. No. 11,699,571.

(51) Int. Cl.
*C23C 16/458* (2006.01)
*C23C 16/509* (2006.01)
(Continued)

(52) U.S. Cl.
CPC .... *H01J 37/32091* (2013.01); *C23C 16/4586* (2013.01); *C23C 16/509* (2013.01);
(Continued)

(58) Field of Classification Search
CPC ............... C23C 16/4586; C23C 16/509; H01J 37/32091; H01J 37/32715; H01L 21/67069; H01L 21/6833
See application file for complete search history.

(56) References Cited

U.S. PATENT DOCUMENTS 4,622,094 A     11/1986  Otsubo
5,478,429 A     12/1995  Komino et al.
(Continued)

FOREIGN PATENT DOCUMENTS

CN   109166787 A   1/2019
JP   H06236858 A   8/1994
(Continued)

OTHER PUBLICATIONS

Application No. PCT/US2021/041923 , International Preliminary Report on Patentability, Mailed On Feb. 2, 2023, 5 pages.
(Continued)

*Primary Examiner* — Michael P Wieczorek
(74) *Attorney, Agent, or Firm* — Kilpatrick Townsend & Stockton LLP (57) ABSTRACT

Exemplary semiconductor substrate supports may include a pedestal shaft. The semiconductor substrate supports may include a platen. The platen may define a fluid channel across a first surface of the platen. The semiconductor substrate supports may include a platen insulator positioned between the platen and the pedestal shaft. The semiconductor substrate supports may include a conductive puck coupled with the first surface of the platen and configured to contact a substrate supported on the semiconductor substrate support. The semiconductor substrate supports may include a conductive shield extending along a backside of the platen insulator and coupled between a portion of the platen insulator and the pedestal shaft.

18 Claims, 6 Drawing Sheets

(51) Int. Cl.
  *H01J 37/32*    (2006.01)
  *H01L 21/67*    (2006.01)
  *H01L 21/683*   (2006.01)

(52) U.S. Cl.
  CPC .. *H01J 37/32715* (2013.01); *H01L 21/67069* (2013.01); *H01L 21/6833* (2013.01); *H01J 2237/2007* (2013.01); *H01J 2237/20235* (2013.01)

(56) References Cited

U.S. PATENT DOCUMENTS

| | | | |
|---|---|---|---|
| 5,578,532 | A | 11/1996 | van de Ven et al. |
| 5,968,379 | A * | 10/1999 | Zhao ............... C23C 16/4586 219/121.52 |
| 6,081,414 | A | 6/2000 | Flanigan et al. |
| 6,148,762 | A | 11/2000 | Fukuda et al. |
| 6,490,145 | B1 | 12/2002 | Kholodenko et al. |
| 6,740,853 | B1 | 5/2004 | Johnson et al. |
| 7,163,896 | B1 | 1/2007 | Zhu et al. |
| 7,214,630 | B1 | 5/2007 | Varadarajan et al. |
| 8,232,176 | B2 | 7/2012 | Lubomirsky et al. |
| 8,264,154 | B2 | 9/2012 | Banner et al. |
| 9,373,517 | B2 * | 6/2016 | Yang ................... C23C 16/503 |
| 9,741,584 | B1 | 8/2017 | Park et al. |
| 11,615,966 | B2 | 3/2023 | Jiang et al. |
| 11,699,571 | B2 | 7/2023 | Paul et al. |
| 12,142,459 | B2 | 11/2024 | Paul et al. |
| 2002/0135969 | A1 | 9/2002 | Weldon et al. |
| 2003/0010292 | A1 | 1/2003 | Kholodenko et al. |
| 2004/0211764 | A1 | 10/2004 | Doering et al. |
| 2006/0005930 | A1 | 1/2006 | Ikeda et al. |
| 2007/0091539 | A1 | 4/2007 | Buchberger, Jr. et al. |
| 2007/0218623 | A1 | 9/2007 | Chua et al. |
| 2007/0281495 | A1 | 12/2007 | Mallick et al. |
| 2008/0142160 | A1 | 6/2008 | Ueda et al. |
| 2008/0173237 | A1 | 7/2008 | Collins et al. |
| 2009/0200269 | A1 | 8/2009 | Kadkhodayan et al. |
| 2009/0274590 | A1 * | 11/2009 | Willwerth ......... H01L 21/68792 422/186.04 |
| 2009/0283217 | A1 | 11/2009 | Lubomirsky et al. |
| 2010/0018648 | A1 | 1/2010 | Collins et al. |
| 2010/0087052 | A1 | 4/2010 | Xu |
| 2011/0151678 | A1 | 6/2011 | Ashtiani et al. |
| 2011/0297650 | A1 | 12/2011 | Tavassoli et al. |
| 2012/0033340 | A1 | 2/2012 | Roy et al. |
| 2014/0021673 | A1 | 1/2014 | Chen et al. |
| 2014/0073144 | A1 | 3/2014 | Chatterjee et al. |
| 2014/0118751 | A1 | 5/2014 | Rajagopalan et al. |
| 2015/0031211 | A1 | 1/2015 | Sapre et al. |
| 2015/0232983 | A1 | 8/2015 | West et al. |
| 2016/0049323 | A1 | 2/2016 | Ye et al. |
| 2016/0225652 | A1 | 8/2016 | Tran et al. |
| 2017/0062266 | A1 | 3/2017 | Deng et al. |
| 2017/0162384 | A1 | 6/2017 | Chen et al. |
| 2017/0221734 | A1 | 8/2017 | Lindley |
| 2018/0286674 | A1 | 10/2018 | Manna et al. |
| 2018/0330980 | A1 * | 11/2018 | Liang ................... C23C 16/505 |
| 2018/0350668 | A1 | 12/2018 | Cheng et al. |
| 2019/0203350 | A1 | 7/2019 | Khaja et al. |
| 2019/0272982 | A1 | 9/2019 | Hawrylchak et al. |
| 2020/0126759 | A1 | 4/2020 | Yokota et al. |
| 2020/0185204 | A1 | 6/2020 | Ueda |
| 2020/0251345 | A1 | 8/2020 | Yin et al. |
| 2022/0020594 | A1 | 1/2022 | Jiang et al. |
| 2022/0076919 | A1 | 3/2022 | Paul et al. |
| 2022/0076920 | A1 | 3/2022 | Paul et al. |
| 2022/0076922 | A1 | 3/2022 | Paul et al. |
| 2022/0084798 | A1 * | 3/2022 | Iizuka ............... H01J 37/32449 |
| 2022/0130713 | A1 | 4/2022 | Paul et al. |

FOREIGN PATENT DOCUMENTS

| | | |
|---|---|---|
| JP | H11233291 A | 8/1999 |
| JP | 2004214312 A | 7/2004 |
| JP | 2004342984 A | 12/2004 |
| JP | 2005136350 A | 5/2005 |
| JP | 2007189222 A | 7/2007 |
| JP | 2009065133 A | 3/2009 |
| JP | 2009256789 A | 11/2009 |
| JP | 2011520288 A | 7/2011 |
| JP | 2011521453 A | 7/2011 |
| JP | 2014017406 A | 1/2014 |
| JP | 2015529969 A | 10/2015 |
| JP | 2016503578 A | 2/2016 |
| JP | 2018204104 A | 12/2018 |
| JP | 2020092196 A | 6/2020 |
| KR | 20040015814 A | 2/2004 |
| KR | 20050041926 A | 5/2005 |
| KR | 20050066362 A | 6/2005 |
| KR | 20050084286 A | 8/2005 |
| KR | 20070015031 A | 2/2007 |
| KR | 20090101093 A | 9/2009 |
| KR | 20110015607 A | 2/2011 |
| KR | 20110020829 A | 3/2011 |
| KR | 20150074008 A | 7/2015 |
| KR | 20160001672 A | 1/2016 |
| KR | 20180059261 A | 6/2018 |
| KR | 20180131423 A | 12/2018 |
| KR | 20190141786 A | 12/2019 |
| TW | 200837876 A | 9/2008 |
| TW | 201430994 A | 8/2014 |
| TW | 201529883 A | 8/2015 |
| TW | 201530642 A | 8/2015 |
| TW | 201616603 A | 5/2016 |
| TW | 201923817 A | 6/2019 |
| WO | 2019195188 A1 | 10/2019 |
| WO | 2019209453 A1 | 10/2019 |
| WO | 2019212592 A1 | 11/2019 |

OTHER PUBLICATIONS

Application No. PCT/US2021/041923, International Search Report and the Written Opinion, Mailed On Nov. 11, 2021, 8 pages.
Application No. PCT/US2021/047843, International Preliminary Report on Patentability, Mailed On Mar. 23, 2023, 7 pages.
Application No. PCT/US2021/047843, International Search Report and the Written Opinion, Mailed On Dec. 21, 2021, 10 pages.
Application No. PCT/US2021/048125, International Preliminary Report on Patentability, Mailed On Mar. 23, 2023, 6 pages.
Application No. PCT/US2021/048125, International Search Report and Written Opinion, Mailed On Dec. 23, 2021, 10 pages.
Application No. PCT/US2021/048146, International Preliminary Report on Patentability, Mailed On Mar. 23, 2023, 7 pages.
Application No. PCT/US2021/048146, International Search Report and Written Opinion, Mailed On Dec. 21, 2021, 10 pages.
Application No. JP2023-515299, Notice of Decision to Grant, Mailed On Aug. 20, 2024, 3 pages.
Application No. KR10-2023-7011907, Office Action, Mailed On Jul. 17, 2024, 11 pages.
Application No. KR10-2023-7011908, Office Action, Mailed On Jul. 23, 2024, 13 pages.

* cited by examiner

SEMICONDUCTOR PROCESSING CHAMBERS AND METHODS FOR DEPOSITION AND ETCH

CROSS-REFERENCES TO RELATED APPLICATIONS

The present technology is a continuation of application Ser. No. 17/014,195 issuing as U.S. Pat. No. 11,699,571 on Jul. 11, 2023, and is related to U.S. Patent Publication No. 2022/0076922, filed as U.S. patent application Ser. No. 17/014,224 on Sep. 8, 2020, and U.S. Patent Publication No. 2022/0076919, filed as U.S. patent application Ser. No. 17/014,177 on Sep. 8, 2020. Each of these applications is hereby incorporated by reference in its entirety for all purposes.

TECHNICAL FIELD

The present technology relates to semiconductor processing. More specifically, the present technology relates to systems and methods for depositing and treating materials including flowable films.

BACKGROUND

Integrated circuits are made possible by processes which produce intricately patterned material layers on substrate surfaces. Producing patterned material on a substrate requires controlled methods of formation and removal of exposed material. As device sizes continue to shrink, material formation may affect subsequent operations. For example, in gap filling operations a material may be formed or deposited to fill a trench or other feature formed on a semiconductor substrate. As features may be characterized by higher aspect ratios and reduced critical dimensions, these filling operations may be challenged. For example, as the deposition may occur at the top and along sidewalls of the feature, continued deposition may pinch off the feature including between sidewalls within the feature, and may produce voids within the feature. This can impact device performance and subsequent processing operations.

Thus, there is a need for improved systems and methods that can be used to produce high quality devices and structures. These and other needs are addressed by the present technology.

SUMMARY

Exemplary semiconductor substrate supports may include a pedestal shaft. The semiconductor substrate supports may include a platen. The platen may define a fluid channel across a first surface of the platen. The semiconductor substrate supports may include a platen insulator positioned between the platen and the pedestal shaft. The semiconductor substrate supports may include a conductive puck coupled with the first surface of the platen and configured to contact a substrate supported on the semiconductor substrate support. The semiconductor substrate supports may include a conductive shield extending along a backside of the platen insulator and coupled between a portion of the platen insulator and the pedestal shaft.

In some embodiments, the supports may include an insulative edge ring seated on a recessed ledge of the conductive puck. The insulative edge ring may extend radially outward along an exterior edge of the platen insulator. The insulative edge ring may contact the conductive shield. The conductive puck may include a coating along a surface configured to contact the substrate. The coating may extend along the recessed ledge on which the insulative edge ring is seated. The coating may include a similar insulative material of which the insulative edge ring is composed. The supports may include a lift pin assembly extending through the platen, the platen insulator, the conductive puck, and the conductive shield. The lift pin assembly may include a lift pin, a liner, a holder, and a counterweight. The holder may define a recess in which a portion of the platen insulator is disposed. The supports may include an RF rod extending through the pedestal shaft. The RF rod may be electrically coupled with the platen. The supports may include a rod insulator extending about the RF rod along a length of the RF rod. The pedestal shaft may be seated on a hub, and the rod insulator may extend into the hub. The rod insulator may extend within a portion of the platen insulator. The pedestal shaft and the platen insulator may define a purge path extending to the rod insulator at the platen insulator. The purge path may continue along an interior and an exterior of the rod insulator.

Some embodiments of the present technology may encompass semiconductor processing systems. The systems may include a chamber body. The systems may include a substrate support configured to support a semiconductor substrate. The substrate support may include a pedestal shaft. The substrate support may include a platen defining a fluid channel across a first surface of the platen. The substrate support may include a platen insulator positioned between the platen and the pedestal shaft. The substrate support may include a conductive puck coupled with the first surface of the platen and configured to contact a substrate supported on the semiconductor substrate. The substrate support may include a conductive shield extending along a backside of the platen insulator and coupled between a portion of the platen insulator and the pedestal shaft. The systems may include a faceplate. The chamber body, the substrate support, and the faceplate may define a processing region. The systems may include a high-frequency plasma source coupled with the faceplate. The systems may include a low-frequency plasma source coupled with the substrate support.

In some embodiments, the substrate support may include an electrostatic chuck. The semiconductor processing system may include a DC power supply coupled with the substrate support. The low-frequency plasma source may be configured to operate at less than or about 2 MHz. The high-frequency plasma source may be configured to operate at greater than or about 13.56 MHz at a pulsing frequency of less than or about 20 kHz at a duty cycle of less than or about 20%. The high-frequency plasma source may be configured to generate a plasma at an effective power of less than or about 5 W. The systems may include an insulative edge ring seated on a recessed ledge of the conductive puck. The insulative edge ring may extend radially outward along an exterior edge of the platen insulator. The insulative edge ring may contact the conductive shield. The conductive puck may include a coating along a surface configured to contact the substrate. The coating may extend along the recessed ledge on which the insulative edge ring is seated. The systems may include a first L-C filter coupled with the substrate support and configured to virtually ground the high-frequency plasma source through the substrate support. The systems may include a second L-C filter coupled with the faceplate and configured to virtually ground the low-frequency plasma source to the chamber body.

Such technology may provide numerous benefits over conventional systems and techniques. For example, by utilizing substrate supports according to the present technology, improved cooling and plasma management may be afforded. Additionally, by performing deposition according to embodiments of the present technology, repeatable plasma generation during deposition operations may be produced. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Amorphous silicon may be used in semiconductor device manufacturing for a number of structures and processes, including as a sacrificial material, for example as a dummy gate material, or as a trench fill material. In gap filling operations, some processing may utilize flowable films formed under process conditions to limit conformality of deposition, which may allow the deposited material to better fill features on the substrate. Flowable silicon material may be characterized by relatively high amounts of hydrogen, and may be less dense than other formed films. Consequently, subsequent treatment operations may be performed to cure the produced films. Conventional technology may utilize a UV curing process to remove hydrogen and process the film. However, UV curing may result in significant film shrinkage, which may cause stress on features as well as produce voids within the structure. Additionally, the treatment is formed in a separate chamber from the deposition chamber, which will reduce throughput by increase processing time.

As feature sizes continue to shrink, flowable films may be challenged for narrow features, which may be further characterized by higher aspect ratios. For example, pinching of the feature may more readily occur due to deposition on sidewalls of the feature, which in small feature sizes may further restrict flow further into the feature, and may produce voids. Some conventional flowable film formation may be performed by producing radicals in a remote capacitively-coupled plasma region or in a remote plasma source unit coupled with the chamber. However, for cyclic formation in high aspect ratio features, this process may provide unreliable deposition. For example, as radicals pass through chamber components, such as a faceplate, recombination may challenge consistent provision of radical effluents. Additionally, remote plasma sources may be incapable of limiting an amount of deposition within small-pitch features. This may over-deposit within the feature, which may then limit or prevent complete penetration of treatment effluents. This may cause damage during later processing, which may lead to scrapped substrates.

The present technology may overcome these limitations by decoupling high-frequency and low-frequency power sources and utilizing a trigger sequence allowing a low-power, repeatable plasma generation to be performed for short periods of time. This may limit deposition during trench fill to a tightly controlled amount, as well as assuring complete treatment during a subsequent treatment operation. Additionally, the present technology may incorporate substrate support assemblies that may better control temperature drift during treatment operations to increase assurance of a stable and repeatable temperature with each deposition cycle. After describing general aspects of a chamber according to some embodiments of the present technology in which plasma processing operations discussed below may be performed, specific chamber configurations and methodology may be discussed. It is to be understood that the present technology is not intended to be limited to the specific films, chambers, or processing discussed, as the techniques described may be used to improve a number of film formation processes for any number of materials, and may be applicable to a variety of processing chambers and operations.

Figure 1:
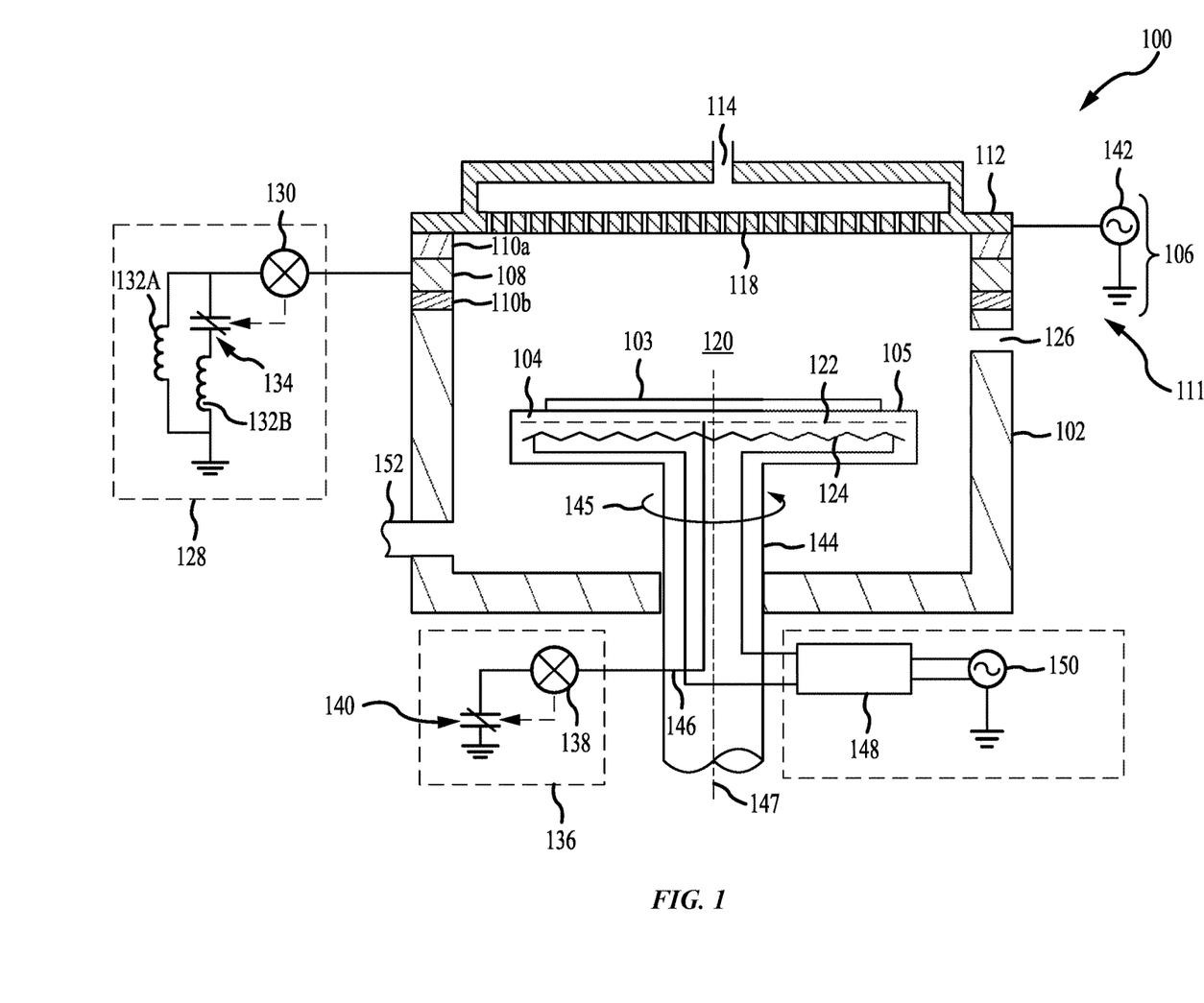
FIG. 1 shows a schematic cross-sectional view of an exemplary processing chamber according to some embodiments of the present technology.

FIG. 1 shows a cross-sectional view of an exemplary processing chamber 100 according to some embodiments of the present technology. The figure may illustrate an overview of a system incorporating one or more aspects of the present technology, and/or which may perform one or more deposition or other processing operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
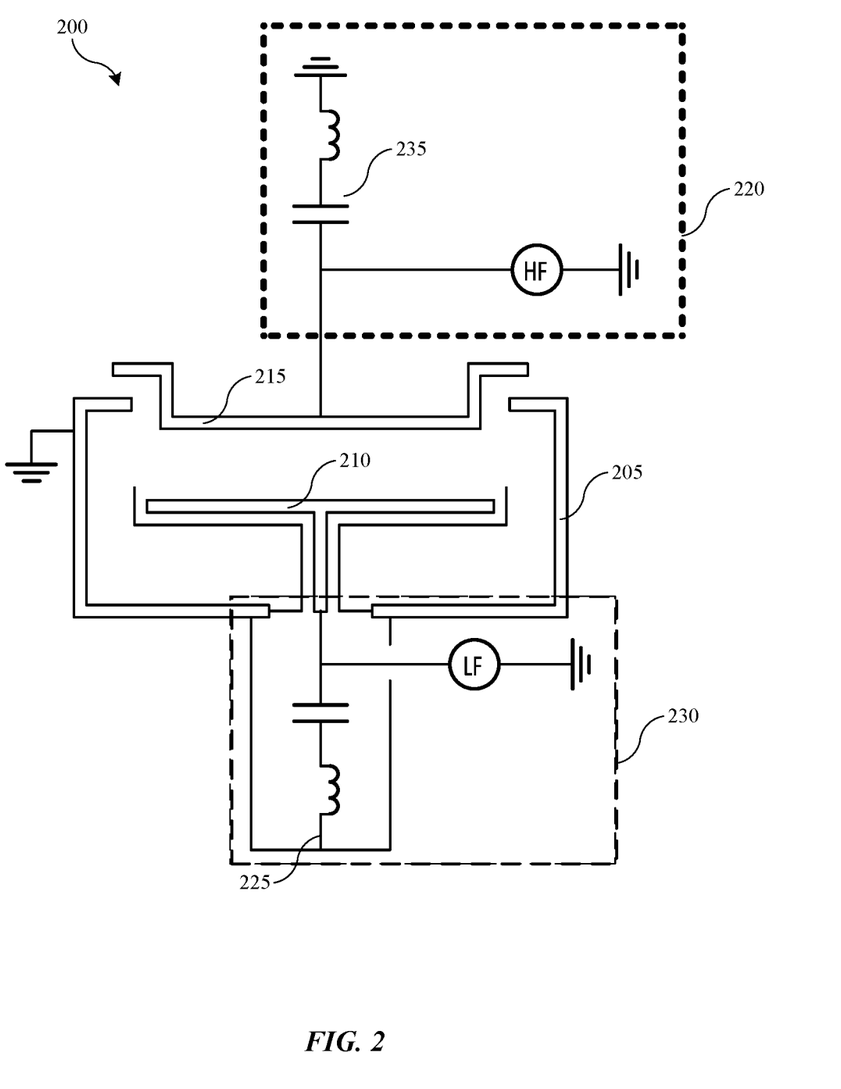
FIG. 2 shows a schematic partial cross-sectional view of a chamber according to some embodiments of the present technology.

FIG. 2 shows a schematic partial cross-sectional view of a processing chamber 200 according to some embodiments of the present technology. Chamber 200 may include any feature, component, or characteristic of processing chamber 100 described above, and may illustrate additional features of the chamber, including specific power source coupling with the chamber. For example, chamber 200 may include a chamber body 205. The chamber may include a substrate support 210, which may be configured to support a substrate during semiconductor processing. The chamber may include a faceplate 215, which with the pedestal and chamber body may define a processing region above a substrate being processed.

Some conventional processing systems may generate a plasma within the processing region by applying power to the faceplate while grounding the pedestal, or applying source power to the pedestal and grounding the faceplate. In some systems an additional bias power may be coupled with the pedestal to increase directionality of plasma effluents. It is to be understood that a separate DC power supply for electrostatic chucking may be coupled with the pedestal as previously described with processing chamber 100, which may also be operated to further bias a produced plasma within the processing chamber in addition to chucking the substrate. The present technology may differ from conventional configurations by coupling two separate plasma power sources with the showerhead and pedestal as illustrated. For example, a first plasma power source 220 may be coupled with the showerhead, and a second plasma power source 230 may be coupled with the pedestal. In some embodiments the first plasma power source 220 may be a high-frequency plasma power source, and the second plasma power source 230 may be a low-frequency plasma power source. In some embodiments, low-frequency plasma power source 230 may be separate from a DC power source, which may be used for electrostatic coupling a substrate to the pedestal.

The low-frequency plasma power source may operate at a first frequency that is less than or about 2 MHZ, and may operate at a frequency that is less than or about 1.5 MHz, less than or about 1.0 MHz, less than or about 800 kHz, less than or about 600 kHz, less than or about 500 kHz, less than or about 400 kHz, less than or about 350 kHz, less than or about 300 kHz, less than or about 250 kHz, less than or about 200 kHz, or less. The high-frequency plasma power source may operate at a second frequency that is greater than or about 2 MHZ, and may be greater than or about 10 MHz, greater than or about 13 MHz, such as 13.56 MHz, greater than or about 15 MHz, greater than or about 20 MHz, greater than or about 40 MHz, or higher.

Additional aspects of the plasma sources may be used to further tune the generated plasma within the processing region. For example, chambers according to embodiments of the present technology may be used to fill high-aspect ratio features, where a discreet amount of deposition may be produced to limit void formation within the feature being filled. Conventional chambers may be limited in a reduction of plasma power based on an inability to produce a repeatable low-power plasma for a limited period of time. The present technology may be used to produce material layers characterized by a thickness of less than or about 10 nm per cycle. To accomplish this limited deposition, either the deposition period may be limited, or the power used during deposition may be reduced. Conventional systems may not be capable of reducing plasma power below or about 100 W, which may increase the amount of deposition material, and reducing the formation period to accommodate this higher power may limit the ability to produce a repeatable plasma during a multiple cycle deposition.

The present technology overcomes these issues by producing a low-power deposition plasma, which may be characterized by an effective plasma power of less than or about 20 W, and may be characterized by an effective plasma power of less than or about 15 W, less than or about 10 W, less than or about 8 W, less than or about 6 W, less than or about 5 W, less than or about 4 W, less than or about 3 W, or less. To produce this lower power plasma during a deposition operation, the system may operate the high-frequency plasma power at a pulsing frequency of less than or about 200 kHz, and may operate the plasma power at a pulsing frequency of less than or about 150 kHz, less than or about 100 kHz, less than or about 80 kHz, less than or about 70 kHz, less than or about 60 kHz, less than or about 50 kHz, less than or about 40 kHz, less than or about 30 kHz, less than or about 20 kHz, less than or about 10 kHz, or less. Additionally, and at any of the pulsing frequencies noted, the high-frequency plasma power source may be operated at a reduced duty cycle, which may be less than or about 50%, and may be less than or about 45%, less than or about 40%, less than or about 35%, less than or about 30%, less than or about 25%, less than or about 20%, less than or about 15%, less than or about 10%, less than or about 5%, or less.

In some embodiments, the reduced pulsing frequency and duty cycle, may challenge plasma generation in a consistent manner. The low-power plasma once generated may produce a low-rate deposition to limit deposition per cycle, however, ignition may be challenged. Accordingly, in some embodiments, the plasma power may operate with a trigger sequence to facilitate plasma generation during deposition. For example, as noted above, in some embodiments the deposition operation may be performed without the low-frequency plasma power source. However, in some embodiments during the deposition operation, the low-frequency plasma power source may be operated to facilitate ignition. Additionally, the low-frequency plasma power source may not be operated, and a power spike may be applied with the high-frequency plasma power source to facilitate ignition. The power spike may be applied directly with power management, or through a level-to-level operation of the high-frequency plasma power source.

The low-frequency plasma power source may also be operated to control plasma formation and ion directionality during processing. By delivering the low-frequency plasma power through the pedestal, the plasma sheath formed at this powered electrode may benefit directionality of ions into the feature being densified. The low-frequency plasma power source may be operated at any of the power levels or pulsing frequencies noted above, although in some embodiments the second power source 230 may be operated at a greater plasma power than the first power source 220 during a treatment operation. For example, during the treatment the plasma power delivered by the second power source may be greater than or about 50 W, and may be greater than or about 100 W, greater than or about 200 W, greater than or about 300 W, greater than or about 400 W, greater than or about 500 W, greater than or about 600 W, greater than or about 700 W, greater than or about 800 W, or more. By increasing the plasma power of the low-frequency power supply during the treatment plasma formation, a greater amount of plasma effluents may be generated. Applying greater low-frequency power from the pedestal may increase a directionality of delivery perpendicular to a plane across the substrate.

Additional adjustments may be made to further increase etching of deposited material along sidewalls of the features by adjusting one or more characteristics of the plasma power or bias power being supplied. For example, in some embodiments both the plasma power source and bias power source may be operated in a continuous wave mode. Additionally, one or both of the power sources may be operated in a pulsed mode. In some embodiments, the high-frequency source power may be operated in a continuous wave mode or pulsed mode while the low-frequency power may be operated in a pulsed mode during the treatment. A pulsing frequency for the low-frequency plasma power source may be less than or about 1,000 Hz, and may be less than or about 900 Hz, less than or about 800 Hz, less than or about 700 Hz, less than or about 600 Hz, less than or about 500 Hz, less than or about 400 Hz, less than or about 300 Hz, less than or about 200 Hz, less than or about 100 Hz, or less. The duty cycle of the second power supply may be less than or about 50%, and the low-frequency plasma power may be operated at a duty cycle of less than or about 45%, less than or about 40%, less than or about 35%, less than or about 30%, less than or about 25%, less than or about 20%, less than or about 15%, less than or about 10%, less than or about 5%, or less. By operating the low-frequency power at a reduced duty cycle, such as an on-time duty of less than or about 50%, a greater amount of time per cycle may be performing a more isotropic etch within the feature based on operation of the high-frequency power supply, which may better remove material from the sidewalls during a densification operation.

The first plasma power source 220 may be coupled with ground virtually through the pedestal. For example, as illustrated, a first L-C filter 225 may be coupled with the pedestal and may virtually ground the high-frequency plasma source through the pedestal. Similarly, the second plasma power source 230 may be coupled with ground through the chamber. For example, a second L-C filter 235 may be coupled with the faceplate, which may virtually ground the low-frequency plasma source, such as to the chamber body or an external ground. By separating the high-frequency power supply and the low-frequency power supply, improved plasma generation and operation may be provided.

Figure 3:
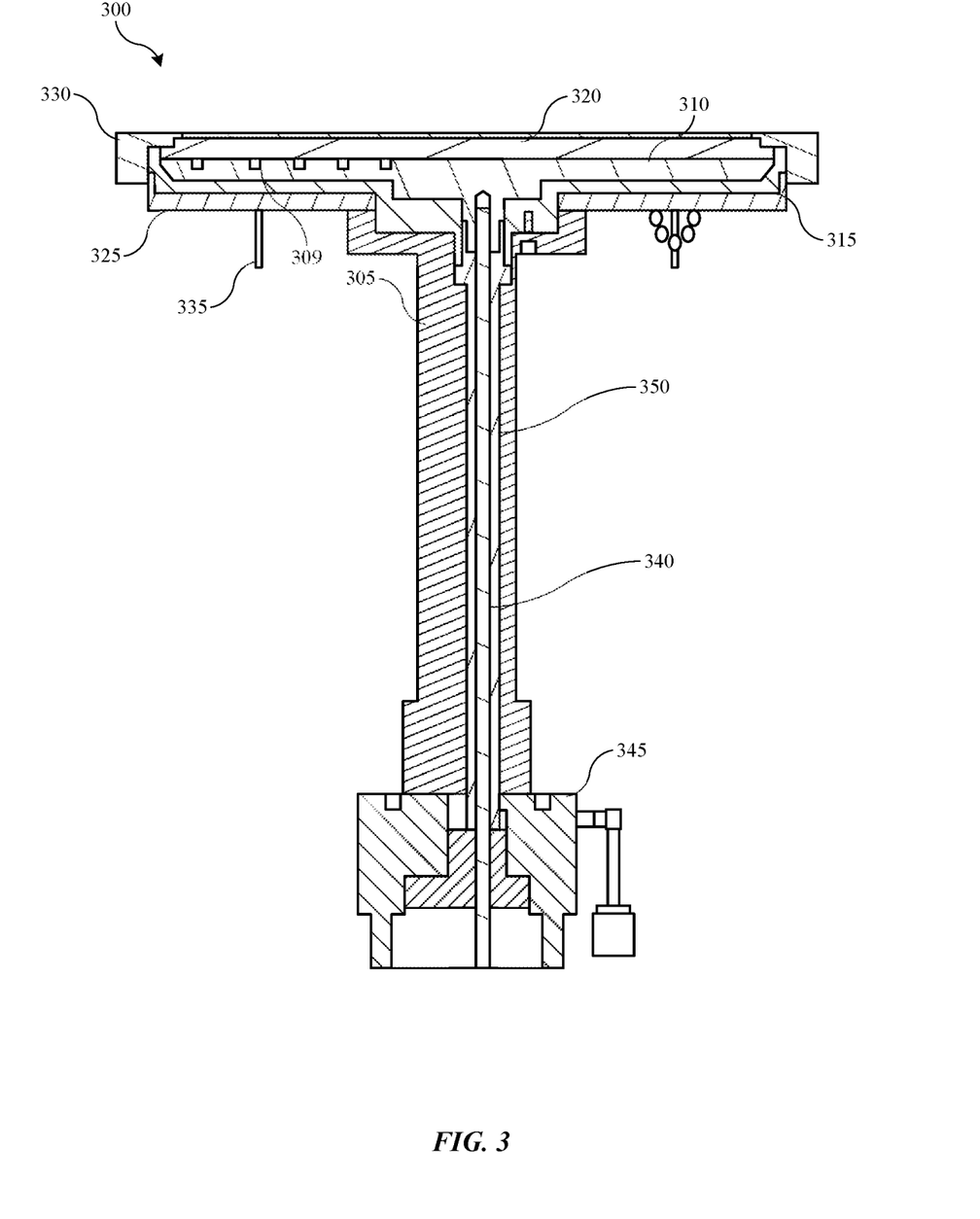
FIG. 3 shows a schematic partial cross-sectional view of a substrate support assembly according to some embodiments of the present technology.

FIG. 3 shows a schematic partial cross-sectional view of a substrate support assembly 300 according to some embodiments of the present technology. As explained above, the present technology may be used in some embodiments to perform low-temperature depositions and cures within a single chamber. Semiconductor support assemblies configured for low temperature operations at low plasma powers may suffer from a number of issues. For example, when electrostatic chucks are employed, a substrate support surface or puck may be a dielectric material in which an electrode is included. The electrode, which may include multiple electrodes, may be one or both of a chucking electrode with which a DC power supply may be coupled, as well as a plasma generating electrode with which an RF power supply may be coupled.

Substrate support assemblies according to some embodiments of the present technology may include a low-frequency power supply coupled with the substrate support assembly as discussed above. The substrate support assembly may also be configured to maintain a substrate at a temperature for both deposition and treatment operations. Substrate support assemblies according to some embodiments of the present technology may overcome temperature gradients caused by a dielectric material by either maintaining a conductive puck in contact with the substrate, or by forming a thin coating of dielectric material across a surface of the conductive puck. Based on the low level plasma processes being performed according to some embodiments of the present technology, concern for substrate movement may be limited, and thus an electrostatic chuck may not be needed. Consequently, the puck may be conductive in some embodiments, which may improve heat transfer and cooling of the substrate. Plasma performance may impact substrate temperature as well. For example, the present technology may include cyclic formation and treatment of a flowable film. Conventional technologies may move the substrate between two chambers separately performing deposition and treatment, which may facilitate ensuring the substrate is maintained at a setpoint temperature during each deposition operation. Because temperature may affect deposition rates and film flow properties, maintaining a consistent substrate temperature for each deposition cycle may improve film formation through a feature.

Because the present technology may produce a treatment plasma in the same processing chamber in which the deposition occurs, cooling the substrate back down to a deposition setpoint may become an issue due to the plasma exposure during treatment. While the deposition plasma may occur at low plasma power, the treatment may be performed at higher plasma powers from the source plasma, which may be ten times as much plasma power or more, and which may increase the thermal load on the substrate. This may cause the substrate temperature to increase during the treatment operation much more than may occur during deposition. By being able to maintain a colder conductive surface in contact with the wafer, or with a thin coating in between, the present technology may be capable of improved cooling by increasing heat transfer to the backside of the substrate.

Substrate support assembly 300 may be similar to substrate support 104 or substrate support 210, and may include any feature, component, or characteristic of those supports described above, including any associated components or power supplies. Substrate support assembly 300 may include a pedestal shaft 305, which may be a conductive material. A platen 310 may define one or more fluid channels 309 in a surface of the platen. Fluid channels 309 may include one or more channels, such as a spiral or other circuitous pattern, which may couple with a fluid source through an inlet and outlet channel through the shaft. The fluid source may include a cooled or heated fluid in embodiments, including a chiller to further reduce a fluid temperature. The substrate support may be configured to maintain a temperature below or about 100° C., and in some embodiments may be configured to maintain a temperature below or about 80° C., below or about 60° C., below or about 40° C., below or about 20° C., below or about 0° C., below or about −5° C., below or about −10° C., below or about −15° C., below or about −20° C., below or about −25° C., or lower.

Disposed between the platen 310 and the pedestal shaft 305 may be a platen insulator 315, which may extend fully about the platen 310. In some embodiments the platen 310 may be fully recessed within a volume defined by the insulator 315. Pedestal shaft 305 and platen 310 may each be made of a conductive material, such as a metal like aluminum or any other material that may be thermally and or electrically conductive. Puck 320 may be coupled with the platen 310, and in some embodiments may also be made of aluminum or some other conductive material. A substrate may be in direct contact with the puck in some embodiments, and in some embodiments a coating may be formed between the puck and a substrate. A conductive shield 325 may extend along a surface of platen insulator 315 opposite a surface on which the platen 310 may be seated. For example, conductive shield 325 may be coupled between a portion of the platen insulator 315 and the pedestal shaft 305.

Substrate support assembly 300 may include one or more lift pin assemblies 335 extending through the conductive shield, the platen insulator, the platen, and the conductive puck. In some embodiments, an insulative edge ring 330 may be seated on a recessed ledge defined on the puck and extending about an outer edge of the puck. As illustrated, edge ring 330 may extend radially outward along an exterior edge of the platen insulator 315, and may extend over and contact an outer edge of the conductive shield 325 in some embodiments. Accordingly, in some embodiments the conductive platen and puck may be fully insulated from the conductive shield and pedestal shaft to limit or prevent shorting between the components. The conductive shield coupling with the pedestal shaft, which may all be conductive materials, may provide a more symmetric ground path for the high-frequency plasma power source, which may improve plasma uniformity in some embodiments. Extending through the platen may be an RF rod 340, which may be coupled with an RF match of a low-frequency power supply as discussed above. Pedestal shaft 305 may be seated on a hub 345, through which the RF rod 340 may extend. RF rod 340 may have a rod insulator 350 extending about the RF rod, and that may extend with the RF rod through each of the hub 345, pedestal shaft 305, platen insulator 315, and platen 310. By having the rod insulator 350 extend along a length of the RF rod and into the hub, an RF leak path to the pedestal shaft may be prevented at the hub.

At an opposite end of the RF rod 340, the RF rod may be coupled with the conductive platen 310, which may operate as a plasma electrode. As will be further explained below, in embodiments for which a dielectric coating extends along the puck 320, the conductive platen may also operate as a chucking electrode. Because the platen itself may operate as the electrode, in some embodiments the RF rod 340 may recess into a connection socket formed in the platen. The connection may be with any connector type, including a Multilam or other multiple contact connector on the RF rod. As illustrated, rod insulator 350 may at least partially extend within platen insulator 315. The platen insulator and the rod insulator may operate to fully enclose the RF rod 340 through the components of the substrate support assembly extending into the processing chamber, which may further reduce or limit leak paths, which may otherwise lead to stray arcing. These components will be described further below.

Figure 4:
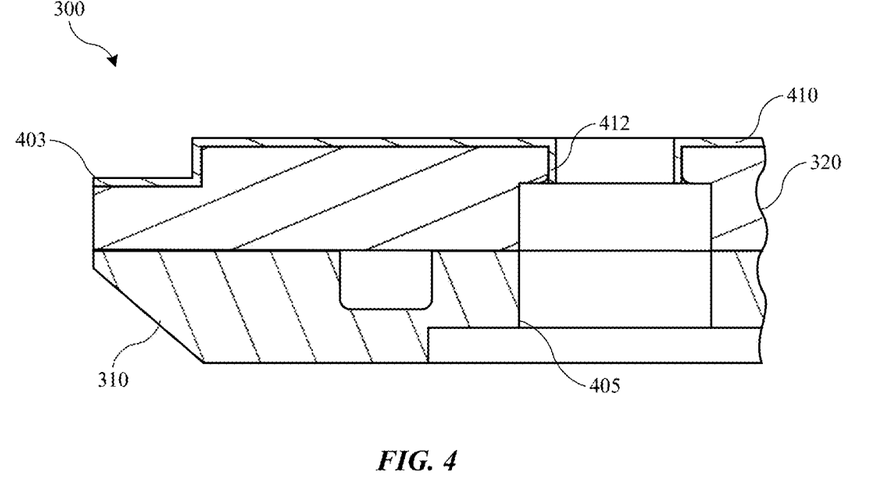
FIG. 4 shows a schematic partial cross-sectional view of a substrate support assembly according to some embodiments of the present technology.

FIG. 4 shows a schematic partial cross-sectional view of substrate support assembly 300 according to some embodiments of the present technology, and may illustrate additional features of the assembly. As described above, in some embodiments the puck 320 may be in direct contact with a substrate being processed. Additionally, in some embodiments, a dielectric coating may be formed overlying a surface of the puck. By forming a dielectric layer between the puck and a substrate being processed, the puck may be operated as an electrostatic chuck. The coating may also accommodate features of the substrate support assembly. For example, a recessed ledge 403 may be formed at an exterior edge of the puck 320, and on which the edge ring may be seated. Additionally, a counterbore aperture 405 for a lift pin assembly may be formed through the platen 310 and the puck 320. A coating 410 may be formed across a substrate support surface of the puck 320, and may be formed conformally to extend across the recessed ledge to an exterior edge of the puck. The coating 410 may also extend along sidewalls 412 of aperture 405, such as long the smaller inner diameter portion of the counterbore apertures. This may help prevent ignition of gases at the lift pin holes in some embodiments.

Electrostatic chucks often have a dielectric puck, which may form a temperature delta across the puck, and which may cause leakage of RF through the puck. In low power plasma processing according to some embodiments of the present technology, a dielectric puck may further challenge generating plasma due to losses through the puck. To limit an effect of losses, the present technology may instead form the dielectric coating, which may be maintained less than or about 1 mm in thickness in some embodiments, and may be maintained less than or about 800 μm in thickness, less than or about 600 μm in thickness, less than or about 500 μm in thickness, less than or about 400 μm in thickness, less than or about 300 μm in thickness, less than or about 200 μm in thickness, or less, although a thickness may be maintained greater than or about 100 μm or greater than or about 200 μm to ensure a complete coverage of the puck surface to limit or prevent shorting. Coating 410 may be made of any materials, and in some embodiments may be formed of the same material as edge ring 330, which may be a ceramic or other dielectric material, such as aluminum oxide, or any other oxide, nitride, carbide, or combination material that may limit shorting from the substrate support assembly.

In some embodiments, recessed channels may be formed along the surface of puck 320, which may allow a fluid flow, such as a gas flow of helium, argon, or some other gas, to be flowed up through the pedestal shaft and across the surface of the puck. Because the fluid may be cooled during delivery through the substrate support assembly, the gas may facilitate cooling of the substrate from a backside of the substrate. Accordingly, by modulating the fluid flow through the puck, improved cooling may be provided over conductive cooling from the support assembly alone. For example, by increasing a fluid flow during and/or after a treatment operation, the temperature of the substrate may more readily be returned to a deposition setpoint temperature. By providing multiple recessed channels delivering separate fluid flow paths, different regions may be cooled at different rates, which may accommodate uneven temperature distributions across the substrate. Consequently, thermal load issues produced during treatment operations may be accommodated with substrate support assemblies according to the present technology, which may improve uniformity of deposition operations by ensuring a consistent substrate temperature at each deposition cycle.

Figure 5:
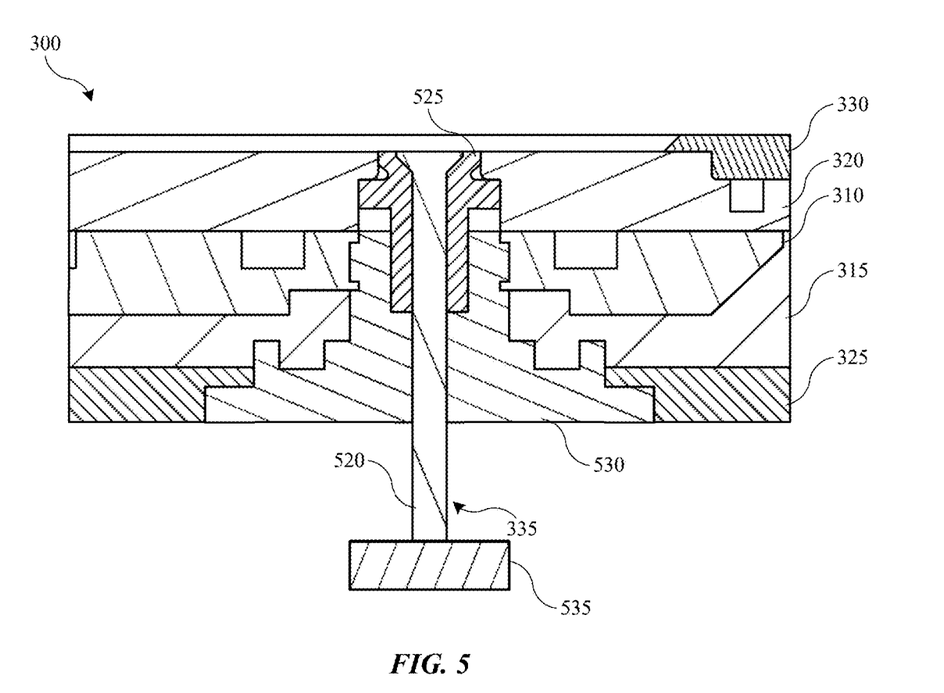
FIG. 5 shows a schematic partial cross-sectional view of a substrate support assembly according to some embodiments of the present technology.

FIG. 5 shows a schematic partial cross-sectional view of substrate support assembly 300 according to some embodiments of the present technology, and may illustrate additional aspects of lift pin assembly 335 described above, as well as illustrating additional features of the support assembly. As illustrated, substrate support assembly 300 may include a conductive shield 325 extending along a backside of the platen components. A platen insulator 315 may be seated over the conductive shield. A conductive platen 310 may be positioned on the insulator, and may define a number of fluid channels as previously described for cooling the substrate support assembly and substrate. The substrate support assembly 300 may include a puck 320 and an edge ring 330 as previously described.

Lift pin assembly 335 may extend through the conductive shield 325, the platen insulator 315, the platen 310, and the puck 320 as illustrated. The lift pin assembly may be formed to limit plasma generation within the lift pin hole, as well as to limit entrapment of helium, which may flow into the aperture through the puck. As illustrated and discussed above, a counterbore aperture may be formed through the puck, with a smaller diameter aperture portion extending to the puck surface. The lift pin 520 may be characterized by a top plug, which may be positioned just below an access from the aperture through the puck. For example, the lift pin 520 may be recessed less than or about 2 mm from the substrate support surface of the puck, and may be recessed less than or about 1 mm from the surface of the puck, less than or about 800 µm, less than or about 700 µm, less than or about 600 µm, less than or about 500 µm, less than or about 400 µm, less than or about 300 µm, less than or about 200 µm, or less.

A liner 525 may be fitted into the aperture through the puck and seated against an inner edge of the puck 320. The liner 525 may define an interior path through which the lift pin may extend, and may define a tapered entry that may allow the lift pin to recess and seat on the liner as shown. The liner may be held in place by a holder 530, which may be fitted into the conductive shield 325, the platen insulator 315, and the platen 310. Each of the liner and holder may be formed of dielectric or insulative components in some embodiments. A counterweight 535 may be coupled with an opposite end of the lift pin 520 from the substrate contact end, and may maintain the lift pin in a recessed position during substrate processing. The lift pin assembly may be passive in operation, and may be activated by a vertically recessing substrate support assembly. The counterweight may be contacted from below as the substrate support retracts from an operational position, and may extend the lift pin up through the assembly to lift the substrate from the support. Any number of lift pin assemblies may be included in some embodiments of the present technology.

Because of the conductive components, which may be operated as an electrostatic chuck, a path through the lift pin assembly apertures may provide access for arcing between the components. Accordingly, in some embodiments the holder may be formed and coupled with the assembly components to increase a line distance, such as by forming a tortuous path that may lower the potential and limit arcing from the conductive components. For example, a portion of the holder 530 may extend into the platen 310. Additionally, the holder 530 may define a recess such as an annular notch as illustrated, in which a portion of the platen insulator may be positioned.

Figure 6A:
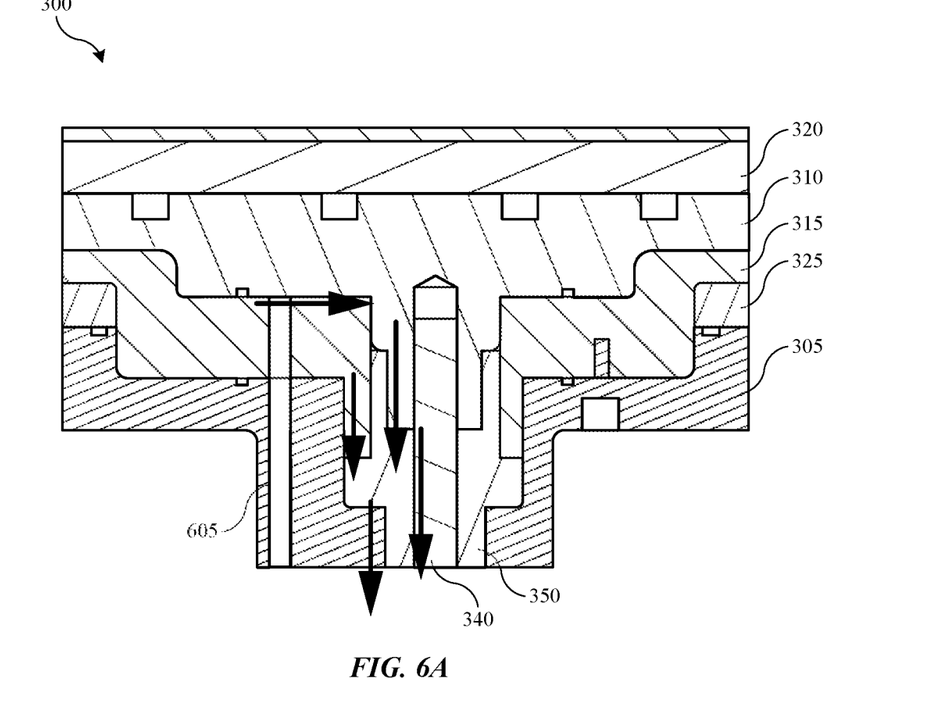
FIGS. 6A-6C show a schematic partial cross-sectional views of a substrate support assembly components according to some embodiments of the present technology.

FIG. 6A shows a schematic partial cross-sectional view of substrate support assembly 300 according to some embodiments of the present technology, and may illustrate additional features of a purge path extending through the assembly. Although the processing region of the chamber may be maintained at vacuum pressure, internal components within the pedestal shaft may be maintained closer to atmospheric pressure. During low temperature operation, condensation may occur within these regions, which may cause arcing at the RF rod, or other corrosion within the substrate support assembly. Accordingly, in some embodiments an additional purge path may be formed extending about the RF rod and associated components to ensure condensation may be limited or prevented within the system.

As illustrated, a purge path 605 may extend through the pedestal shaft and platen insulator 315. The purge path 605 may then extend laterally into the central region in which the RF rod extends through the shaft. In some embodiments a gap may be formed between the RF rod insulator 350 and other components within the platen 310. As illustrated, when the purge flow, which may be nitrogen or any other material, impinges on the platen 310, the flow may be directed down and about the platen, as well as circumferentially about the rod insulator, and internally and externally about the rod insulator 350. The purge path may extend down along an exterior of the rod insulator, and may extend down along an interior surface of the rod insulator, such as between the rod insulator and the RF rod. This may ensure that air may be purged from the substrate support assembly to protect from condensation.

Figure 6B:
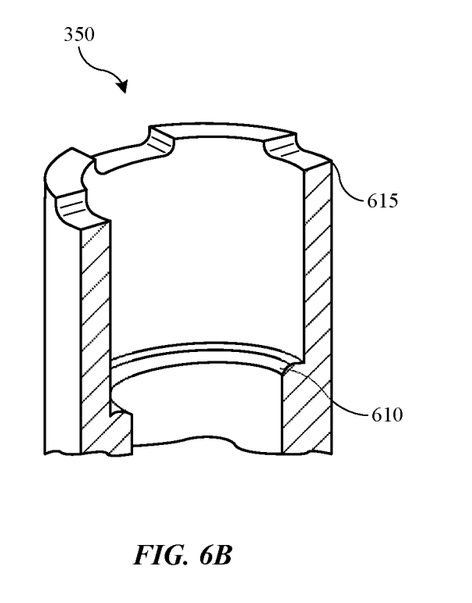
Figure 6C:
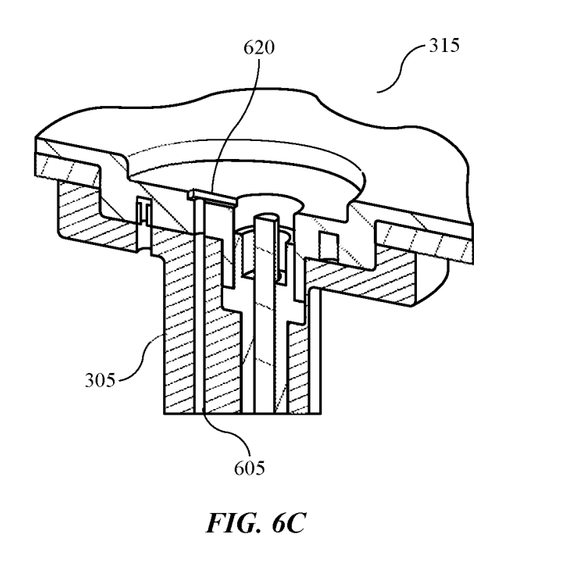

FIG. 6B shows a schematic partial cross-sectional view of a rod insulator 350 according to some embodiments of the present technology. As illustrated, rod insulator 350 may define a ledge 610 along an interior surface, and which may constrict an inner diameter from an end portion that may extend about the platen 310 as illustrated above. The diameter may then be reduced as the rod insulator extends along a length of the RF rod through the pedestal. Additionally, rod insulator 350 may define one or more recesses 615 in an end of the rod insulator where the rod insulator may abut the platen 310. Recesses 615 may ensure purge gas may extend from an exterior side of the rod insulator to an interior side to purge along the RF rod. Because the accesses may be formed in a region recessed within the platen insulator, RF leakage may be controlled or prevented. This is further shown in FIG. 6C where purge path 605 is shown extending up pedestal shaft 305 and into platen insulator 315. An additional recess 620 may be formed which may form a lateral channel between the platen insulator and the platen when seated on the insulator. The channel may then provide fluid access into the central channel for purging about the RF rod.

Figure 7:
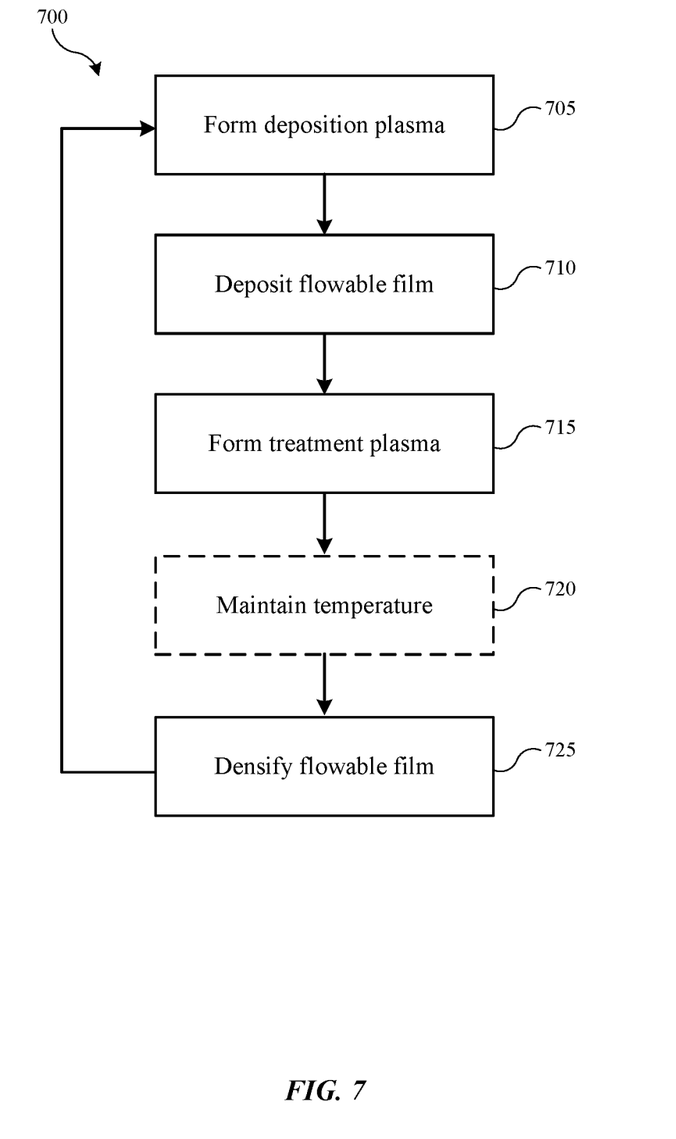
FIG. 7 shows exemplary operations in a processing method according to some embodiments of the present technology.

Processing chamber 100 and/or processing chamber 200 may be utilized in some embodiments of the present technology for processing methods that may include formation, etching, or curing of materials for semiconductor structures. The chambers may include any of the substrate support assembly components or features described above. It is to be understood that the chamber described is not to be considered limiting, and any chamber that may be configured to perform operations as described may be similarly used. FIG. 7 shows exemplary operations in a processing method 700 according to some embodiments of the present technology. The method may be performed in a variety of processing chambers and on one or more mainframes or tools, including processing chamber 100 or processing chamber 200 described above. Method 700 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 700 may include additional operations prior to initiation of the listed operations. For example, additional processing operations may include forming structures on a semiconductor substrate, which may include both forming and removing material. For example, transistor structures, memory structures, or any other structures may be formed. Prior processing operations may be performed in the chamber in which method 700 may be performed, or processing may be performed in one or more other processing chambers prior to delivering the substrate into the semiconductor processing chamber or chambers in which method 700 may be performed. Regardless, method 700 may optionally include delivering a semiconductor substrate to a processing region of a semiconductor processing chamber, such as processing chamber 200 described above, or other chambers that may include components as described above. The substrate may be deposited on a substrate support, which may be a pedestal such as substrate support 210, which may be or include substrate support assembly 300, and which may reside in a processing region of the chamber, such as processing volume 120 described above.

A substrate to be processed may be or include any number of materials used in semiconductor processing. The substrate material may be or include silicon, germanium, dielectric materials including silicon oxide or silicon nitride, metal materials, or any number of combinations of these materials, which may be the substrate or materials formed on the structure. Features may be characterized by any shape or configuration according to the present technology. In some embodiments, the features may be or include a trench structure or aperture formed within the substrate. Although the features may be characterized by any shapes or sizes, in some embodiments the features may be characterized by higher aspect ratios, or a ratio of a depth of the feature to a width across the feature. For example, in some embodiments features may be characterized by aspect ratios greater than or about 5:1, and may be characterized by aspect ratios greater than or about 10:1, greater than or about 15:1, greater than or about 20:1, greater than or about 25:1, greater than or about 30:1, greater than or about 40:1, greater than or about 50:1, or greater. Additionally, the features may be characterized by narrow widths or diameters across the feature including between two sidewalls, such as a dimension less than or about 20 nm, and may be characterized by a width across the feature of less than or about 15 nm, less than or about 12 nm, less than or about 10 nm, less than or about 9 nm, less than or about 8 nm, less than or about 7 nm, less than or about 6 nm, less than or about 5 nm, or less.

In some embodiments, method 700 may include optional treatment operations, such as a pretreatment, that may be performed to prepare a surface of the substrate for deposition. Once prepared, method 700 may include delivering one or more precursors to a processing region of the semiconductor processing chamber housing the structure. The precursors may include one or more silicon-containing precursors, as well as one or more diluents or carrier gases such as an inert gas or other gas delivered with the silicon-containing precursor. Although the present method will be explained in relation to producing a flowable silicon film, it is to be understood the method and/or chambers described may be used to produce any number of materials according to embodiments of the present technology. A plasma may be formed of the deposition precursors including the silicon-containing precursor at operation 705. The plasma may be formed within the processing region, which may allow deposition materials to deposit on the substrate. For example, in some embodiments a capacitively-coupled plasma may be formed within the processing region by applying plasma power to the faceplate as previously described. For example, a high-frequency power supply as discussed above may be operated at a reduced effective plasma power to deposit materials within the features on the substrate.

A silicon-containing material may be deposited on the substrate at operation 710 from plasma effluents of the silicon-containing precursor. The material may be a flowable silicon-containing material in some embodiments, which may be or include amorphous silicon. The deposited materials may at least partially flow into the features on the substrate to provide a bottom-up type of gap fill. The deposited material may flow into the bottom of the feature, although an amount of material may remain on the sidewalls of the substrate as illustrated. Although the amount deposited may be relatively small, the remaining material on the sidewalls may limit subsequent flow.

The power applied during deposition may be a lower power plasma, which may limit dissociation, and which may maintain an amount of hydrogen incorporation in the deposited materials. This incorporated hydrogen may contribute to the flowability of the materials deposited. Accordingly, in some embodiments a plasma power source may deliver a plasma power to the faceplate of less than or about 100 W, and may deliver a power of less than or about 90 W, less than or about 80 W, less than or about 70 W, less than or about 60 W, less than or about 50 W, or less. This power may be further attenuated by operating the high-frequency power supply at a pulsing frequency and duty cycle as previously explained, which may produce an effective power below or about 10 W, and may produce an effective power below or about 5 W, as discussed above.

Subsequent an amount of deposition, in some embodiments of the present technology a treatment or curing process may be formed that is configured to densify the formed material, and may beneficially clean or etch back material on the sidewalls of the feature. This process may be performed in the same chamber as the deposition, and may be performed in a cyclic process to fill the feature. In some embodiments the silicon-containing precursor flow may be halted and the processing region may be purged. Subsequent a purge, a treatment precursor may be flowed into the processing region of the processing chamber. The treatment precursor may be or include hydrogen, helium, argon, or another inert material, which may not be chemically reactive with the film. A treatment plasma may be formed at operation 715, which may also be a capacitively-coupled plasma formed within the processing region. While the deposition plasma formed may be formed by applying a high-frequency plasma power to the faceplate or showerhead, and which in some embodiments may not include another power source being engaged. The treatment may utilize both the high-frequency power supply as well as a low-frequency power supply coupled with the substrate support as previously discussed. The high-frequency power supply may be operated at a first power level and the low-frequency power supply may be operated at a second power level during the treatment, and the two power levels may be similar or different in embodiments of the present technology.

While the high-frequency power supply may be operated at a pulsed and low-effective power during the deposition plasma, the high-frequency power supply may be operated in a continuous wave configuration during the treatment, which may be at any of the plasma powers previously described. The low-frequency power supply may be operated in a pulsing mode during the treatment, which may be at any of the pulsing frequencies and/or duty cycles as previously described.

During the deposition operation, the low-frequency power supply may not be operated. As discussed above, to enable a repeatable plasma generation at low power, a trigger sequence may be utilized to ensure plasma generation during each deposition operation. The trigger sequence may include a first period of time and a second period of time, which together may create a deposition period of time. To limit deposition in some embodiments, the deposition period of time may be less than or about 30 seconds, and may be less than or about 20 seconds, less than or about 15 seconds, less than or about 10 seconds, less than or about 8 seconds, less than or about 6 seconds, less than or about 5 seconds, less than or about 4 seconds, or less. The first period of time may be less than the second period of time, and the first period of time may be used to ensure plasma generation occurs, while limiting an effect on the deposition process. Accordingly, in some embodiments the first period of time may be less than or about 2 seconds, and may be less than or about 1 second, less than or about 0.5 seconds, less than or about 0.4 seconds, less than or about 0.3 seconds, less than or about 0.2 seconds, less than or about 0.1 seconds, less than or about 0.09 seconds, less than or about 0.08 seconds, less than or about 0.07 seconds, less than or about 0.06 seconds, less than or about 0.05 seconds, or less.

In some embodiments a first power may be applied by the high-frequency power source during the first period of time, which may be higher than a second power applied by the high-frequency power source during the second period of time. For example, during the first period of time, the first power may be greater than or about 50 W, and may be greater than or about 80 W, greater than or about 100 W, greater than or about 120 W, greater than or about 140 W, greater than or about 160 W, greater than or about 180 W, greater than or about 200 W, or higher. The high-frequency power source may then apply power during the second period of time at any of the effective powers discussed above during the remainder of the deposition time. Additionally, the high-frequency power source may be operated consistently during the deposition time, but during the first period of time the low-frequency power source may be applied at any power level discussed above to ensure ignition. In another example, the high-frequency power supply may be operated in a multi-level pulsing configuration during the first period of time before switching the desired effective power during the second period of time. The multi-level pulsing may include a number of pulses, which may each be less than 0.1 seconds, for example, such as less than or about 50 microseconds, less than or about 40 microseconds, less than or about 30 microseconds, less than or about 20 microseconds, or less, and which all occur during the first period of time. The pulses may include a higher initial pulse for a first fraction of the pulse, followed by a lower second pulse for a second fraction of the pulse. The two portions of the pulse may occur at any power levels previously described.

During the treatment operation, the substrate support assembly may be used to maintain the temperature of the substrate at operation 720, and may continue to control the temperature prior to a subsequent deposition operation. For example, in addition to conductive cooling through the substrate support assembly, in some embodiments a backside gas may be provided and modulated to further control the substrate temperature during the higher power treatment operation. Simultaneously, or additionally, plasma effluents delivered more directionally may penetrate the remaining film formed at the bottom of the feature, and may reduce hydrogen incorporation to densify the film at operation 725. Subsequent the treatment, the backside gas may continue to be flowed to bring the temperature back down to a deposition setpoint prior to a subsequent deposition cycle.

Although the deposition may be formed to several nanometers or more, by performing an etch process as previously described, the thickness of densified material may be controlled to be at a thickness of less than or about 100 Å, and may be less than or about 90 Å, less than or about 80 Å, less than or about 70 Å, less than or about 60 Å, less than or about 50 Å, less than or about 40 Å, less than or about 30 Å, less than or about 20 Å, less than or about 10 Å, or less. By controlling the thickness of the deposited material, conversion through the entire thickness may be performed more readily, and penetration issues common in conventional processes may be resolved. The process may then be fully repeated for any number of cycles to continue to produce the densified material up through the feature.

Any number of precursors may be used with the present technology with regard to the deposition precursors used during any of the formation operations. Silicon-containing precursors that may be used during may include, but are not limited to, silane ($SiH_4$), disilane ($Si_2H_6$), or other organosilanes including cyclohexasilanes, silicon tetrafluoride ($SiF_4$), silicon tetrachloride ($SiCl_4$), dichlorosilane ($SiH_2Cl_2$), tetraethyl orthosilicate (TEOS), as well as any other silicon-containing precursors that may be used in silicon-containing film formation. The silicon-containing material may be nitrogen-free, oxygen-free, and/or carbon-free in some embodiments. In any of the operations one or more additional precursors may be included, such as inert precursors, which may include Ar, diatomic hydrogen, He, or other materials such as nitrogen, ammonia, or other precursors.

Temperature and pressure may also impact operations of the present technology. For example, in some embodiments to facilitate film flow, the process may be performed at a temperature below or about 20° C., and may be performed at a temperature less than or about 10° C., less than or about 0° C., less than or about −10° C., less than or about −20° C., less than or about −30° C., or lower. The temperature may be maintained in any of these ranges throughout the method, including during the treatment and densifying. Pressure within the chamber may be kept relatively low for any of the processes as well, such as at a chamber pressure of less than or about 10 Torr, and pressure may be maintained at less than or about 8 Torr, less than or about 6 Torr, less than or about 5 Torr, less than or about 4 Torr, less than or about 3 Torr, less than or about 2 Torr, less than or about 1 Torr, or less. Additionally, the pressure may be maintained at different levels during the deposition and the treatment in some embodiments. For example, the pressure may be maintained greater than or about 1 Torr during the deposition, such as greater than or about 2 Torr, greater than or about 3 Torr, or higher, and the pressure may be maintained less than or about 1 Torr during the treatment, such as less than or about 0.8 Torr, less than or about 0.5 Torr, less than or about 0.1 Torr, or less. By performing processes according to some embodiments of the present technology, improved fill of narrow features utilizing silicon-containing or other flowable materials may be produced, while ensuring adequate temperature control of the substrate within a single processing chamber.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A processing method, comprising:
    forming a plasma of a silicon-containing precursor;
    depositing a flowable film on a semiconductor substrate with plasma effluents of the silicon-containing precursor, wherein the semiconductor substrate is housed in a processing region of a semiconductor processing chamber, wherein the semiconductor substrate defines a feature within the semiconductor substrate, and wherein the processing region is at least partially defined between a faceplate and a substrate support on which the semiconductor substrate is seated;
    flowing a purge gas vertically through a purge path defined between a pedestal shaft and a platen insulator and downward between a rod insulator and a RF rod;
    forming a treatment plasma within the processing region of the semiconductor processing chamber; and
    densifying the flowable film within the feature defined within the semiconductor substrate with plasma effluents of the treatment plasma.

2. The method of claim 1, wherein the pedestal shaft is maintained at a pressure higher than a pressure in the processing region.

3. The method of claim 1, wherein the method is performed at a temperature of less than or about 20° C.

4. The method of claim 1, wherein a thickness of the densified material is less than or about 100 Å.

5. The method of claim 4, further comprising a second cycle of depositing, flowing, forming, and densifying, wherein each cycle controls a thickness of the densified material to be less than or about 90 Å.

6. The method of claim 1, wherein the RF rod is coupled with a conductive platen of the substrate support.

7. The method of claim 6, comprising operating the conductive platen as a plasma electrode, a chucking electrode, or a combination thereof.

8. A processing method, comprising:
    applying a high frequency plasma power, having a frequency of greater than 2 MHz, to a faceplate to form a plasma of a silicon-containing precursor;
    depositing a flowable film on a semiconductor substrate with plasma effluents of the silicon-containing precursor, wherein the semiconductor substrate is housed in a processing region of a semiconductor processing chamber, wherein the semiconductor substrate defines a feature within the semiconductor substrate, and wherein the processing region is at least partially defined between the faceplate and a substrate support on which the semiconductor substrate is seated;
    grounding the substrate support through a conductive shield coupled with a pedestal shaft of the substrate support;
    applying a low-frequency plasma power supply, having a frequency of less than or about 2 MHZ, coupled with the substrate support to form a treatment plasma within the processing region of the semiconductor processing chamber; and
    densifying the flowable film within the feature defined within the semiconductor substrate with plasma effluents of the treatment plasma.

9. The method of claim 8, wherein the conductive shield is insulated from a substrate support surface of the substrate support.

10. The method of claim 8, wherein the conductive shield is formed from one or more conductive materials.

11. The method of claim 10, wherein the conductive shield provides a ground path for the faceplate.

12. The method of claim 10, wherein the pedestal shaft is formed from one or more conductive materials.

13. A processing method, comprising:
    forming a plasma of a silicon-containing precursor;
    depositing a flowable film on a semiconductor substrate with plasma effluents of the silicon-containing precursor, wherein the semiconductor substrate is housed in a processing region of a semiconductor processing chamber, wherein the semiconductor substrate defines a feature within the semiconductor substrate, and wherein the processing region is at least partially defined between a faceplate and a substrate support on which the semiconductor substrate is seated;

applying a low-frequency plasma power supply, having a frequency of less than or about 2 MHZ, coupled with the substrate support to form a treatment plasma within the processing region of the semiconductor processing chamber; and densifying the flowable film within the feature defined within the semiconductor substrate with plasma effluents of the treatment plasma;

wherein a plasma power source maintains a plasma power to the faceplate of less than or about 90 W.

14. The method of claim 13, wherein the plasma power is maintained at less than or about 60 W.

15. The method of claim 13, wherein the plasma power is operated at a pulsing frequency of less than or about 150 kHz.

16. The method of claim 13, wherein the plasma power is operated at a duty cycle of less than or about 50%.

17. The method of claim 16, wherein the duty cycle is less than or about 20%.

18. The method of claim 13, wherein an effective power is below or about 10 W.

* * * * *